United States Patent
Hotta et al.

(10) Patent No.: US 8,137,447 B2
(45) Date of Patent: Mar. 20, 2012

(54) ELECTROLESS PLATING SOLUTION, METHOD FOR ELECTROLESS PLATING USING THE SAME AND METHOD FOR MANUFACTURING CIRCUIT BOARD

(75) Inventors: Teruyuki Hotta, Osaka (JP); Takahiro Ishizaki, Osaka (JP); Tomohiro Kawase, Osaka (JP); Masaharu Takeuchi, Osaka (JP)

(73) Assignee: C. Uyemura & Co., Ltd., Osaka (JP)

( * ) Notice: Subject to any disclaimer, the term of this patent is extended or adjusted under 35 U.S.C. 154(b) by 225 days.

(21) Appl. No.: 12/491,920

(22) Filed: Jun. 25, 2009

(65) Prior Publication Data
US 2010/0003399 A1    Jan. 7, 2010

(30) Foreign Application Priority Data

Jul. 1, 2008  (JP) ................ P2008-172657
Jun. 8, 2009  (JP) ................ P2009-137130

(51) Int. Cl.
- *C23C 18/31* (2006.01)
- *C23C 18/34* (2006.01)
- *C23C 18/40* (2006.01)
- *B05D 5/12* (2006.01)

(52) U.S. Cl. ............. 106/1.22; 106/1.23; 106/1.24; 106/1.25; 106/1.26; 106/1.27; 106/1.28

(58) Field of Classification Search ......... 106/1.22, 106/1.23, 1.24, 1.25, 1.26, 1.27, 1.28; 427/99.5, 427/443.1
See application file for complete search history.

(56) References Cited

U.S. PATENT DOCUMENTS

| | | | | |
|---|---|---|---|---|
| 3,267,010 A | * | 8/1966 | Creutz et al. | 205/298 |
| 3,515,563 A | * | 6/1970 | Hodoley et al. | 106/1.23 |
| 3,716,462 A | * | 2/1973 | Jensen | 106/1.22 |
| 3,770,598 A | * | 11/1973 | Creutz | 205/296 |
| 3,915,718 A | * | 10/1975 | Ludwig et al. | 106/1.05 |
| 4,804,410 A | * | 2/1989 | Haga et al. | 106/1.23 |
| 5,910,340 A | * | 6/1999 | Uchida et al. | 106/1.23 |
| 6,736,954 B2 | * | 5/2004 | Cobley et al. | 106/1.26 |
| 6,776,893 B1 | * | 8/2004 | Too et al. | 106/1.26 |
| 6,863,795 B2 | * | 3/2005 | Teerlinck et al. | 205/210 |
| 7,220,296 B1 | * | 5/2007 | Chowdhury et al. | 106/1.23 |
| 7,220,347 B2 | * | 5/2007 | Isono et al. | 106/1.26 |
| 7,651,934 B2 | * | 1/2010 | Lubomirsky et al. | 438/584 |
| 2004/0104124 A1 | * | 6/2004 | Cobley et al. | 205/291 |

FOREIGN PATENT DOCUMENTS
EP          1118696 A1 *  7/2001

* cited by examiner

*Primary Examiner* — Helene Klemanski
(74) *Attorney, Agent, or Firm* — Haverstock & Owens LLP

(57) ABSTRACT

Disclosed is an electroless plating solution exhibiting a good plating metal filling performance even for larger trenches or vias of several to one hundred and tens of μm, in a manner free from voids or seams, and allowing maintenance of stabilized performance for prolonged time. The electroless plating solution contains at least a water-soluble metal salt, a reducing agent for reducing metal ions derived from the water-soluble metal salt, and a chelating agent. In addition, the electroless plating solution contains a sulfur-based organic compound as a leveler having at least one aliphatic cyclic group or aromatic cyclic group to which may be linked at least one optional substituent. The aliphatic cyclic group or the aromatic cyclic group contains optional numbers of carbon atoms, oxygen atoms, phosphorus atoms, sulfur atoms and nitrogen atoms.

8 Claims, 1 Drawing Sheet

ELECTROLESS PLATING SOLUTION, METHOD FOR ELECTROLESS PLATING USING THE SAME AND METHOD FOR MANUFACTURING CIRCUIT BOARD

TECHNICAL FIELD OF THE INVENTION

This invention relates to an electroless plating solution that is able to fill a trench or a via formed in, for example, a printed circuit board in a manner free from electroless plating solution, and to a method for manufacturing a circuit board using the solution.

BACKGROUND OF THE INVENTION

For manufacturing a multilevel circuit board having fine interconnects with a line width of 20 μm and a pattern pitch of 20 μm, a wide variety of plating methods have so far been proposed. A semi-additive method, as typical of these methods, is such a method in which a circuit board is subjected to electroless copper plating as a substrate for electrical copper plating in forming a copper circuit. A circuit pattern is then formed by a resist and the copper circuit is formed by electrical copper plating.

However, with this semi-additive method, the following problem arises as the line width or the pattern pitch becomes finer. That is, misregistration or development defects tend to be produced as a result of formation of the resist, thus possibly producing line breakage or circuit shorting. In addition, the electroless copper plating formed as a substrate for current conduction for electrical copper plating needs to be removed by etching after the processing for electrical copper plating. However, this etching process may give breakage of useful circuit portions or circuit shorting due to insufficient etching.

Another typical method is a full-additive method. With this full-additive method, a catalyst is initially afforded to a circuit board in which vias have already been opened. A circuit pattern then is formed by a resist and a copper circuit is formed solely by electroless copper plating.

However, even with this full additive method, the following problems arise with further refinement of the line width or the pattern pitch. That is, misregistration or development defects tend to be produced as a result of formation of the resist, thus possibly producing line breakage or circuit shorting. In addition, the catalyst is left below the resist by reason of process-related constraints. There are cases where the insulation performance between the circuits tends to be lowered due to the catalyst left, thus possibly leading to shorting with refinement of the circuit pattern.

To overcome the above-mentioned deficiency, such a method is tentatively used in which a trench or a via is formed in a board surface using the laser and the trench or the via thus formed is filled with plating copper by electroless copper plating.

However, the technique used so far in filling the trench or the via by electroless plating is aimed to fabricate a circuit on a wafer having a trench or a via of a diameter or a width equal to 1 μm (=1000 nm) or less. However, a larger trench or via of a diameter or a width equal to several to one hundred and tens of μm, such as is used in a printed circuit board, cannot be filled sufficiently with plating metal by using this technique.

With the electroless plating solution currently used for vias, plating metal can be deposited by increasing the plating thickness. However, in this case, gaps (voids or seams) tend to be produced below the opening part of the via, thus possibly causing line breakages, etc.

A sulfur-based compound so far used in the conventional technique for suppression of voids or seams is contained in a solution for electroplating of acidic copper sulfate used until now for field via plating or dual copper damascene. If the compound is used in a highly alkaline electroless plating solution, it is destabilized and tends to undergo self-decomposition. That is, the compound is unable to remain in a stabilized operating state for prolonged time and hence is not practically useful (see Patent Publications 1 and 2).

[Patent Publication 1] Japanese Patent Application Laid-Open No. 2000-80494

[Patent Publication 2] International Publication No. W05/028088

DISCLOSURE OF THE INVENTION

Problem to be Solved by the Invention

In view of these problems of the related art, it is desirable to provide an electroless plating solution exhibiting optimum properties of filling of plating metal even for a large trench or a via of several to one hundred and tens of μm in a manner free from defects such as voids or seams, and which may demonstrate stable performance for prolonged time. It is further desirable to provide an electroless plating method and a method for manufacturing a circuit board using the electroless plating solution.

Means to Solve the Problem

The present invention has conducted eager searches to accomplish the above problems to be solved and has found that, by using a solution containing a sulfur-containing organic compound having a cyclic group, plating metal may be deposited into the trench or the via without producing defects even under highly alkaline conditions.

An electroless plating solution according to the present invention contains at least a water-soluble metal salt, a reducing agent and a chelating agent, and also contains a leveler composed of at least one of sulfur-based organic compounds represented by the following formulas (I) to (V):

$$R^1\text{—}(S)_n\text{—}R^2 \qquad\qquad (I)$$

$$R^1\text{-}L^1\text{-}(S)_n\text{—}R^2 \qquad\qquad (II)$$

$$R^1\text{-}L^1\text{-}(S)_n\text{-}L^2\text{-}R^2 \qquad\qquad (III)$$

$$R^1\text{-}(S)_n\text{-}L^3 \qquad\qquad (IV)$$

$$R^1\text{-}L^1\text{-}(S)_n\text{-}L^3 \qquad\qquad (V)$$

In the above formulas (I) to (V), n denotes an integer equal to or larger than 1, and $R^1$, $R^2$ each independently denotes an aliphatic cyclic group or an aromatic cyclic group containing optional numbers of carbon, oxygen, phosphorus, sulfur and nitrogen atoms, provided that at least one optional substituent of at least one species may be linked to the aliphatic cyclic or aromatic cyclic group. $L^1$, $L^2$ each independently denotes one of a straight or a branched alkyl, alkyl amino, alkylene or alkoxy chain, and $L^3$ denotes one of an alkyl, alkylene, amino, alkyl amino, alkylene amino, hydroxyl, alkyl hydroxyl, alkylene hydroxyl, carboxyl, alkyl carboxyl, alkylene carboxyl, alkyl amino carboxyl, alkylene amino carboxyl, nitro, alkylnitro, nitrile, alkylnitrile, amide, alkylamide, carbonyl, alkyl carbonyl, sulfonic acid, alkylsulfonic acid, phosphonic acid, alkylphosphonic acid, sulfanyl, sulfinyl and thiocarbonyl groups.

Advantageous Effect of the Invention

With the use of the electroless plating solution according to the present invention, containing a sulfur-based organic compound having a cyclic group, plating metal may be deposited in the trench or in the via without generating voids or seams. The electroless plating solution may thus be used to advantage for manufacturing a printed circuit board capable of handling high speed signals or a printed circuit board having a high interconnect density. Additionally, it may be used in stability for a prolonged time even under high alkaline conditions.

DESCRIPTION OF THE PREFERRED EMBODIMENT

An electroless plating solution according to an embodiment of the present invention is now described in detail.

An electroless plating solution of the present embodiment contains a water-soluble metal salt such as water-soluble cupric salt or a water-soluble nickel salt as a main component. The electroless plating solution also contains at least one reducing agent such as formaldehyde, paraformaldehyde, glyoxylic acid or a salt thereof, hypophorous acid or a salt thereof, or dimethylaminoborane. The electroless plating solution further contains a chelating agent such as ethylene diamine tetraacetate tetrasodium or sodium potassium tartarate, and a leveler such as at least one sulfur-based organic compound.

The electroless plating solution of the present embodiment contains a water-soluble metal salt such as water-soluble cupric salt or a water-soluble nickel salt as a principal component. By having the water-soluble cupric salt or the water-soluble nickel salt as the water-soluble metal salt, it is possible to generate an electroless copper plating solution or an electroless nickel plating solution.

Copper sulfate, copper chloride, copper nitrate, copper acetate or EDTA copper, for example, may be used as the water-soluble cupric salt. The electroless plating solution of the present embodiment may contain at least one species of the water-soluble cupric salt or may contain two or more species in optional proportions. The concentration of the water-soluble cupric salt is preferably 0.001 mol/lit or 0.2 mol/lit. Meanwhile, in case copper is used as a metal ion source, it is not necessarily to have the water-soluble cupric salt contained, such that other metal salts may be used to generate the electroless copper alloy plating solution.

Water-soluble nickel salts may be enumerated by organic nickel salts, such as nickel chloride, nickel sulfate, nickel nitrate, nickel acetate and nickel hypochlorite. The electroless plating solution may contain at least one species of these water-soluble nickel salts or may contain two or more species of the water-soluble nickel salts in optional proportions. The concentration of the water-soluble nickel salts is preferably 0.001 mol/lit to 0.2 mol/lit. In case nickel is contained as metal ion source, it is not necessarily to have the water-soluble nickel salt contained, such that it is also possible to have other metal salts contained to generate the electroless nickel alloy plating solution.

As the reducing agent, those known agents, such as formaldehyde, paraformaldehyde, glyoxylic acid or a salt thereof, a hypophorous acid or a salt thereof, or dimethylaminoborane, may be used. At least one species or two or more species of the reducing agent may be contained in optional proportions. The concentration of the reducing agent is preferably 0.01 mol/lit to 0.5 mol/lit.

As chelating agents, polyamines, polyalkanolamines, polyamino polycarboxylic acids or salts thereof, carboxylic acids or salts thereof, oxycarboxylic acids or salts thereof and amino acids or salts thereof, may be used. At least one species or two or more species of these chelating agents may be contained in optional proportions. By having these chelating agents contained in the electroless plating solution, metal ions, such as copper ions or nickel ions referred to above, may be retained in stability even in an alkaline plating solution.

More specifically, the polyamines may be enumerated by ethylene diamine, triethylene tetramine, hexamethylene tetramine and pentaethylene hexamine. The polyalkanolamines may be enumerated by triethanolamine, diethanolamine and triisopropanolamine. The polyamino polycarboxylic acids may be enumerated by ethylene diamine tetraacetic acid (EDTA), nitrilo triacetic acid, diethylene triamine pentaacetic acid and salts thereof. The oxycarboxylic acids may be enumerated by citric acid, tartaric acid, gluconic acid, malic acid and salts thereof. The amino acids may be enumerated by glycine, glutamine and salts thereof.

As chelating agents contained in the electroless plating solution of the present embodiment, for example, ethylene diamine tetraacetic acid tetrasodium (EDTA-4Na), sodium potassium tartarate (Rochelle salt) and hydroxyethyl ethylene diamine triacetic acid trisodium (HEDTA), may be used to advantage. The chelating agents are preferably used at a concentration of 0.01 mol/lit to 1 mol/lit. The chelating agents are preferably contained in such an amount that the total concentration of the chelating agents in terms of the mol concentration will be 1 to 5 times the number of mols of the water-soluble metal salts.

The electroless plating solution of the present embodiment is featured by containing at least one species of a sulfur-based organic compound as a leveler. The sulfur-based organic compound contained in the electroless plating solution of the present embodiment is a compound containing at least one aliphatic cyclic group or aromatic cyclic group that may be linked to at least one optional substituent of at least one species. The aliphatic cyclic group or aromatic cyclic group contains optional numbers of carbon, oxygen, phosphorus, sulfur and nitrogen atoms.

Specifically, the sulfur-based organic compound contained in the present embodiment is at least one of the compounds represented by the following formulas (I) to (V):

$$R^1-(S)_n-R^2 \quad (I)$$

$$R^1-L^1-(S)_n-R^2 \quad (II)$$

$$R^1-L^1-(S)_n-L^2-R^2 \quad (III)$$

$$R^1-(S)_n-L^3 \quad (IV)$$

$$R^1-L^1-(S)_n-L^3 \quad (V)$$

In the above formulas (I) to (V), n denotes an integer equal to or larger than 1, and $R^1$, $R^2$ each independently denotes aliphatic cyclic or aromatic cyclic group containing optional numbers of carbon, oxygen, phosphorus, sulfur and nitrogen atoms. At least one optional substituent of at least one species may be linked to the aliphatic cyclic or aromatic cyclic group. $L^1$, $L^2$ each independently denotes one of a straight or branched alkyl, alkyl amino, alkylene or alkoxy chain. L3 denotes one of an alkyl, alkylene, amino, alkyl amino, alkylene amino, hydroxyl, alkyl hydroxyl, alkylene hydroxyl, carboxyl, alkyl carboxyl, alkylene carboxyl, alkyl amino carboxyl, alkyleneamino carboxyl, nitro, alkylnitro, nitrile, alkylnitrile, amide, alkylamide, carbonyl, alkyl carbonyl, sulfonic acid, alkylsulfonic acid, phosphonic acid, alkylphosphonic acid, sulfanyl, sulfinyl and thiocarbonyl groups.

The substituents in $R^1$, $R^2$ of the above equations (I) to (V) may be enumerated by alkyl, alkylene, amino, alkyl amino, alkyleneamino, hydroxyl, alkyl hydroxyl, alkylene hydroxyl, carboxyl, alkyl carboxyl, alkylene carboxyl, alkyl amino carboxyl, alkylene amino carboxyl, nitro, alkyl nitro, nitrile, alkyl nitryl, amide, alkyl amide, carbonyl, alkyl carbonyl, sulfonic acid, alkyl sulfonic acid, phosphonic acid, alkyl phosphonic acid, sulfanyl, sulfinyl and thiocarbonyl groups.

The cyclic groups may be enumerated by phenyl, naphtyl, furfuryl, pyridyl, thiazolyl, benzothiazolyl, pyrimidyl, imidazolyl and thiophenyl groups.

Although there is no particular limitation to the sulfur-based organic compounds, these may be enumerated by 2,2'-dipyridyl disulfide, 2,2'-dibenzothiazolyl disulfide, 3,3',5,5'-tetrachlorodiphenyl disulfide, 2,2'-dithiobis (5-nitropyridine), 2,2'-dithio dibenzoic acid, 2,2'-dithiodianiline, 5,5'-dithiobis (2-nitrobenzoic acid), 4,4'-bis(2-amino-6-methyl pyrimidyl)disulfide, 4,4'-dipyridyl sulfide, 6,6'-dithio dinicotinic acid, 2,2'-dithio disalicyclic acid, difurfuryl sulfide, bis(6-hydroxy-2-naphtyl)disulfide, furfuryl methyl disulfide, bis(6-hydroxy-2-naphtyl)disulfide, furfuryl methyl disulfide, bis(2-benzamido phenyl)disulfide, bis(3-hydroxyphenyl)disulfide, diethyl dithiocarbamic acid 2-benzothiazolyl, 5,5'-thiodisalicyclic acid, 5,5'-dithiodisalicyclic acid, (4-pyridylthio) acetic acid, 3-(2-benzothiazolylthio) propionic acid and 4-(2-benzothiazolylthio)formoline. In particular, 2,2'-dipyridyl disulfide, 6,6'-dithio dinicotinic acid, 2,2'-dithio dibenzoic acid and bis(6-hydroxy-2-naphtyl) disulfide may be used to advantage because they help deposit plating metal more satisfactorily in trenches or vias. In addition, they have a wide range of concentrations that may be used and are less susceptible to degradation with lapse of time while being less prone to formation of decomposed products.

These sulfur-based organic compounds are contained preferably in concentration ranges of 0.001 mg/lit to 500 mg/lit and more preferably in concentration ranges of 0.05 mg/lit to 50 mg/lit. In case the concentration is lower than this range, the favorable effect of the compound as a leveler cannot be sufficiently displayed. In case the concentration is higher than the above range, the operation of the compound as a leveler is displayed too strongly with the result that precipitation of the plating metal is inhibited or the thickness of the plating film becomes too thin and hence a sufficient amount of the plating metal cannot be deposited in the trench or in the via. As a result, a printed circuit board produced may be defective. Hence, the sulfur-based organic compound may preferably be contained in a concentration range of 0.05 mg/lit to 50 mg/lit in the electroless plating solution according to the embodiment of the present invention. In this case, the favorable effect of the compound as a leveler may be sufficiently displayed, while the plating metal may be deposited satisfactorily in trenches or vias.

It is observed that sulfur atoms in such sulfur-based organic compound are of such properties that they interact strongly with metals, such that, when contacted with the metal surface, they are adsorbed strongly to the metal surface. The sulfur-based organic compound is diffused through the plating solution along with metal ions, and delivered in this state to a catalyst. It is observed that the amount of the sulfur-based organic compound delivered to an inner part of the trench or the via where the flow of the plating solution is lesser than that on a board surface, is lesser than the amount of the sulfur-based organic compound delivered to the board surface. Hence, the amount of the sulfur-based organic compound delivered to the inside of the trench becomes lesser as the trench bottom is approached, as a result of which bottom-up accumulation progresses to render it possible to deposit plating metal without producing voids in the inside of the trench or the via.

Moreover, with the electroless plating solution containing a sulfur-based organic compound having cyclic groups, it is possible to suppress generation of defects such as voids or seams for a prolonged time, to render it possible to demonstrate satisfactory plating deposition performance in the trench or the via.

More specifically, with electroless copper plating, the reducing power of a reducing agent contained in a plating solution becomes higher as the value of pH increases. It is therefore preferred to set the pH value of the electroless plating solution used to a high alkaline range of pH10 to pH14. It is observed that electrophilic groups, such as sulfonic groups or carboxylic groups, have been introduced into the sulfur-based organic compound used in a conventional electroless plating solution of high alkalinity. If this sulfur-based organic compound is used in the highly alkaline plating solution, thiol anions are stabilized, such that a disulfide linkage tends to be disrupted. The sulfur-based organic compound becomes destabilized and more susceptible to self-decomposition such that it cannot remain stable for prolonged time. As a result, it may not be possible to suppress producing defects such as voids or seams for prolonged time.

With the electroless plating solution of the present embodiment containing a sulfur-based organic compound having cyclic groups which are electron donating groups, disruption of disulfide linkages is less liable to be produced, such that it is possible to suppress the self-decomposition reaction even under highly alkaline conditions. Since the electroless plating solution of the present embodiment may thus be maintained in stabilized state for prolonged time, it is possible to deposit a satisfactory plating skin film free from defects such as voids or seams.

Since the sulphur-based organic compound containing highly absorptive cyclic groups is contained in the electroless plating solution, flow rate dependency that might affect the rate of leveler precipitation increases with the result that the favorable effect of the compound as a leveler may be enhanced. It is thus possible to deposit plating metal in large-sized trenches or vias without producing defects to generate a smooth plating film free of unevennesses.

In the electroless plating solution of the present embodiment, surfactants and plating metal precipitation accelerators may be contained in addition to metal ion sources, such as water-soluble cupric salts or water-soluble nickel salts, reducing agents of the metal ions, chelating agents that retain the metal ion sources in stability and sulfur-based organic compounds used as levelers. Additives such as stabilizers or film property improvers may also be contained in the solution. Although compounds used as these additives are recited hereinbelow, the compounds that may be contained in the electroless plating solution of the present embodiment are not limited to the following compounds.

The surfactants may be enumerated by polyoxyalkylene glycol, alkyl ethers, polyoxyalkylene glycol copolymers and polyoxyalkylene glycol alkyl ether copolymers, which may be contained in the plating solution either singly or in combination. The surfactants are preferably contained in a concentration of 0.1 mg/lit to 10000 mg/lit.

The surfactants exhibit favorable effects that a hydrogen gas evolved as a result of reaction may be more liable to become detached from the trench or the via. In addition, the following favourable effect may be derived.

Specifically, molecules of the sulfur-based organic compounds contained in the electroless plating solution of the present embodiment tend to be aggregated together in the plating solution. Thus, the surface of the plating film deposited by the plating processing tends to become uneven to form vacancies such as voids in the inside of a trench or a via, thus producing deposition defects. By having e.g. the above-mentioned surfactants contained in the plating solution, it becomes possible to promote dispersion of the molecules of the sulfur-based organic compounds to suppress producing defects such as voids or seams in the inside of the trench or the like recess.

The plating metal precipitation accelerators may be enumerated by polyamines, polyalkanol amines, polyamino polycarboxylic acids or salts thereof, chloride ions, nitric acid ions, or 8-hydroxy-7-iodine-5-quinoline sulfonic acid. These may be used alone or in combination.

Examples of polyamines include ethylene diamine, triethylene tetramine, hexamethylene tetramine and pentaethylene hexamine. Examples of polyalkanolamines include triethanolamine, diethanolamine and triisopropanolamine. Examples of polyamino polycarboxylic acids include ethylene diamine tetraacetate (EDTA), nitrylo triacetate and diethylene triamine pentaacetate. By having these plating metal precipitation accelerators contained in the plating solution, it becomes possible to promote the effect of growth of plating from the bottom of the trench or the via (bottom-up effect) such that plating films free from defects such as voids or seams may efficiently be formed at a sufficiently high plating rate.

It is also possible to have stabilizers or film property improvers contained in the electroless plating solution of the present embodiment. As the stabilizers or film property improvers, one or more of known compounds, such as 2,2'-bipyridyl or 1,10-phenanthroline, may be contained in the plating solution either singly or in combination.

As the methods for using the electroless plating solution of the present embodiment generated by having contained the above compounds, any suitable known methods or conditions for using the electroless plating solution may be used without any particular restrictions. However, as a preferred using method, the following conditions are preferably used.

For example, an electroless plating solution of the present embodiment may be formed by using a water-soluble metal salt such as copper sulphate as a main component, a reducing agent, a chelating agent and a leveler composed of a sulfur-based organic compound. In addition, a surfactant, a plating metal precipitation accelerator, a stabilizer and a film property improver are contained in the plating solution. In this solution, there is immersed a circuit board of insulating resin as a material as a subject of plating. On this circuit board, there has been formed a circuit pattern such as trenches by laser light, etc. The board has also been subjected to pre-processing, such as defatting, water-washing or activation, and endowed with a catalyst before immersion in the plating solution. Although there is no particular limitation to the value of pH of the electroless copper plating solution, it is preferably set to pH10 to pH14. By setting pH of the electroless copper plating solution in a range of a high alkaline condition, there may be derived a favorable effect that a reaction of reducing metal ions such as copper ions may proceed efficiently to provide for a satisfactory rate of precipitation of a metal plating film. To keep pH in a range of pH10 to pH14, pH conditioners, such as sodium hydroxide, potassium hydroxide or tetramethyl ammonium hydroxide, may be contained in the electroless plating solution of the present embodiment. Preferably, these compounds as the pH conditioning agents are diluted with water and added to the solution as appropriate.

As regards the temperature at the time of plating of the electroless plating solution of the present embodiment, there is no particular limitation provided that the used temperature allows a reaction of reducing metal ions, such as copper ions derived from copper sulphate, for example, to take place. In order for an efficient reducing reaction to occur, the plating temperature is preferably 20 to 90° C. and more preferably 50 to 70° C.

In conducting electroless plating processing by using an electroless plating solution of the present embodiment, the concentration of metal ions or the reducing agent in the plating solution is lowered, while the pH value of the plating solution is also lowered. This results from metal ions being reduced to metals by the reducing agent with the progress of the plating. It is therefore preferred to supply the water-soluble cupric salt or water-soluble nickel salt as metal ion sources, a reducing agent, a chelating agent and a leveler to the electroless plating solution, either continuously or at stated time intervals, and to keep the concentrations thereof within a preset range. It is also preferred to measure the concentrations of the metal ions or the reducing agent in the plating solution, as well as the pH value, either continuously or at stated time intervals, and to supplement them in accordance with measured results.

In conducting electroless plating using the electroless plating solution of the present embodiment, if there is metal such as copper at the bottom of the trench or the via, the electroless plating solution may be brought into contact with the trench or the via without affording a catalyst to the inside of the trench or the via. That is, the electroless plating solution is directly contacted with the trench or the via without affording the catalyst to the inside of the trench or the via. And then, the catalyst is afforded after the plating metal has been afforded to the inside of the trench or the via to form e.g. copper interconnects. Thus, in depositing the plating metal in the inside of the trench or the via, the electroless plating solution is brought into contact with the trench or the via without affording the catalyst. By so doing, plating metal may sequentially be deposited from the bottom side of the trench or the via. It becomes possible in this manner to suppress overlaying of plating metal due to growth of plating from the sidewall in the vicinity of the opening of the trench or the via to suppress occurrence of defects such as voids ascribable to the overlaying of plating metals. By conducting the electroless plating processing as described above as well as using the electroless plating solution containing the sulfur-based organic compound including the above cyclic groups, plating metal can be deposited satisfactorily without producing defects such as voids or seams, in the trench or the via.

With the electroless plating solution of the present embodiment described above, the sulfur-based organic compound is contained in the plating solution. It is thus possible to deposit plating metal in the trench or the via in a manner free from defects such as voids or seams. Since the sulphur-based organic compound contains cyclic groups, stable states or performance may be maintained without giving self-decomposition even with the use of a high alkaline plating solution. It is thus possible to form a plating film in a state free of defects for a prolonged time. Moreover, since the solution contains a cyclic group, the favorable effect as a leveler may be enhanced with the result that plating metal may be deposited into the trench or the via in an optimum state in a manner free from defects. The formed plating film has a smooth surface free from unevennesses.

The electroless plating solution of the present embodiment having these favorable effects may be used to advantage for plating of printed circuit boards capable of handling a high speed signal or printed circuit boards having a high interconnect density. It is thus possible to manufacture a good printed circuit board free of connection defects such as shorting or breakage and which is high in reliability.

It will be appreciated that the present invention is not restricted to the above-described embodiment such that design changes within the purport of the invention should be included within the scope of the invention. It will also be appreciated that a variety of compounds contained in the above-described embodiments of the present invention are given only for illustration and are not meant to restrict the invention.

EXAMPLES

The present invention is now described with reference to more specified Examples. It will be appreciated that the electroless plating solution according to the present invention is not to be restricted to the following Examples.

Example 1

Using a laser working device, manufactured by Hitachi Via Mechanics, Ltd., usable for via opening, a trench of 20 μm in width and 13 μm in depth was formed in a board prepared by applying a general insulating resin (ABF-GX13 manufactured by Ajinomoto Fine-Techno Co., Inc.)

A catalyst affording process (Thru-Cup process of C. Uyemura & Co., Ltd.: a cleaner conditioner ACL-009, a pre-dip PED-104, catalyst AT-105 and an accelerator AL-106) was then carried out to afford a catalyst (seed layer). Using an electroless copper plating solution, electroless copper plating was carried out for two hours under a temperature condition of 70° C. to fill a trench with plating copper to form a copper plating film. After the plating operation, the filling state of the trench was measured by observing its cross section. The used electroless copper plating solution was of the following composition:

<Composition of an Electroless Copper Plating Solution (Example 1)>
copper sulphate: 0.04 mol/lit
EDTA: 0.1 mol/lit
sodium hydroxide: 4 g/lit
formaldehyde: 4 g/lit
2,2'-bipyridyl: 2 mg/lit
polyethylene glycol (molecular weight: 1000): 1000 mg/lit
2,2'-dipyridyl disulfide: 5 mg/lit Example 2

As in Example 1, a masking tape (851T manufactured by Sumitomo 3M Limited) was applied to a board on which a general insulating resin (ABF-GX13 manufactured by Ajinomoto Fine-Techno Co., Inc.) was formed. The masking tape in its entirety was processed using a laser working device used for via opening (manufactured by Hitachi Via Mechanics, Ltd.) to form a trench of 10 μm in width and 16 μm in depth in the insulating resin.

A catalyst affording process (Thru-Cup process of C. Uyemura & Co., Ltd.: a cleaner conditioner ACL-009, a pre-dip PED-104, a catalyst AT-105 and an accelerator AL-106) was then carried out to afford a catalyst (seed layer). The masking tape was then removed to afford the catalyst only into the trench.

Then, electroless copper plating was carried out for two hours under a temperature condition of 60° C. using an electroless copper plating solution, to fill the trench with plating copper to form a copper plating film. After the plating, the filling state of the trench was measured by visually checking its cross-section. The used electroless copper plating solution was of the following composition:

Composition of Electroless Copper Plating Solution (Example 2)
copper sulphate: 0.04 mol/lit
HEDTA: 0.1 mol/lit
sodium hydroxide: 4 g/lit
formaldehyde: 4 g/lit
2,2'-bipyridyl: 2 mg/lit
polyethylene glycol (molecular weight: 1000): 1000 mg/lit
6,6'-dithio dinocotinic acid: 5mg/lit Comparative Example 1

As in Example 1, using a laser working device, manufactured by Hitachi Via Mechanics, Ltd., usable for via opening, a trench of 20 μm in width and 13 μm in depth was formed in a board prepared by applying a general insulating resin (ABF-GX13 manufactured by Ajinomoto Fine-Techno Co., Inc.)

A catalyst affording process (Thru-Cup process of C. Uyemura & Co., Ltd.: a cleaner conditioner ACL-009, a pre-dip PED-104, a catalyst AT-105 and an accelerator AL-106) was then carried out to afford a catalyst (seed layer). Using a full-additive electroless copper plating solution (Thru-Cup SP2 manufactured by C. Uyemura & Co., Ltd.), an electroless copper plating operation was then carried out for two hours under a temperature condition of 70° C. to fill a trench with plating copper to form a copper plating film. After the plating operation, the filling state of the trench was measured by observing its cross-section.

Comparative Example 2

Using a laser working device, manufactured by Hitachi Via Mechanics, Ltd., usable for via opening, a trench of 20 μm in width and 13 μm in depth was formed in a board prepared by applying a general insulating resin (ABF-GX13 manufactured by Ajinomoto Fine-Techno Co., Inc.)

A catalyst affording process (Thru-Cup process manufactured by C. Uyemura & Co., Ltd.: a cleaner conditioner ACL-009, a pre-dip PED-104, a catalyst AT-105 and an accelerator AL-106) was then carried out to afford a catalyst (seed layer). Using an electroless copper plating solution, an electroless copper plating operation was carried out for two hours at a temperature of 70° C. to fill a trench with plating copper to form a copper plating film. After the plating operation, the filling state of the trench was measured by observing the cross section. The used electroless copper plating solution for the trench circuit formation on a wafer was of the following composition:

<Composition of an Electroless Copper Plating (Comparative Example 2)>
copper sulphate: 0.04 mol/lit
EDTA: 0.1 mol/lit
sodium hydroxide: 4 g/lit
formaldehyde: 4 g/lit
2,2'-bipyridyl: 2 mg/lit
polyethylene glycol (molecular weight: 1000): 1000 mg/lit
sulfopropyl sulfonate: 0.5 mg/lit Comparative Example 3

As in Example 2, a masking tape (851 T manufactured by Sumitomo 3M Limited) was applied to a board carrying thereon a general insulating resin (ABF-GX13 manufactured by Ajinomoto Fine-Techno Co., Inc.) The masking tape in its entirety was processed, using a laser working device used for via opening (manufactured by Hitachi Via Mechanics, Ltd.) to form a trench of 10 μm in width and 16 μm in depth in the insulating resin.

A catalyst affording process (Thru-Cup process manufactured by C. Uyemura & Co., Ltd.: a cleaner conditioner ACL-009, a pre-dip PED-104, a catalyst AT-105 and an accelerator AL-106) was then carried out to afford a catalyst (seed layer). The masking tape was then removed to afford the catalyst only into the trench.

Then, using a full-additive electroless copper plating solution (Thru-Cup SP2 manufactured by C. Uyemura & Co., Ltd.), electroless copper plating was carried out for two hours under a temperature condition of 70° C. to fill the trench with plating copper to form a copper plating film. After the end of the plating, the filling state of the trench was measured by visual check of the cross-section.

Comparative Example 4

As in Example 1, a trench of 20 μtm in width and 13 μm in depth was formed in a board prepared by applying a general insulating resin (ABF-GX13 manufactured by Ajinomoto Fine-Techno Co., Inc.) For forming the trench, a laser working device, manufactured by Hitachi Via Mechanics, Ltd., usable for via opening, was used.

A catalyst affording process (Thru-Cup process manufactured by C. Uyemura & Co., Ltd.: a cleaner conditioner ACL-009, a pre-dip PED-104, a catalyst AT-105 and an accelerator AL-106) was then carried out to afford a catalyst (seed layer). Using an electroless copper plating solution, an electroless copper plating processing was carried out for two hours under a temperature condition of 70° C. to fill a trench with plating copper to form a copper plating film. After the plating operation, the filling state of the trench was measured by observing its cross section. The electroless copper plating solution used was of the following composition:

<Composition of an Electroless Copper Plating Solution (Comparative Example 4)>
copper sulphate: 0.04 mol/lit
EDTA: 0.1 mol/lit
sodium hydroxide: 4 g/lit
formaldehyde: 4 g/lit
2,2'-bipyridyl: 2 mg/lit
polyethylene glycol (molecular weight: 1000): 1000 mg/lit
acediasulfone: 1000 mg/lit Comparative Example 5

As in Example 1, using a laser working device, manufactured by Hitachi Via Mechanics, Ltd., usable for via opening, a trench of 20 μm in width and 13 μm in depth was formed in a board prepared by applying a general insulating resin (ABF-GX13 manufactured by Ajinomoto Fine-Techno Co., Inc.)

A catalyst affording process (Thru-Cup process of C. Uyemura & Co., Ltd.: a cleaner conditioner ACL-009, a pre-dip PED-104, a catalyst AT-105 and an accelerator AL-106) was then carried out to afford a catalyst (seed layer). Using an electroless copper plating solution, an electroless copper plating processing was carried out for two hours at a temperature of 70° C. to fill a trench with plating copper to form a copper plating film. After the plating operation, the filling state of the trench was measured by observing the cross section. The used electroless copper plating solution was of the following composition:

<Composition of an Electroless Copper Plating Solution (Comparative Example 5)>
copper sulphate: 0.04 mol/lit
EDTA: 0.1 mol/lit
sodium hydroxide: 4 g/lit
formaldehyde: 4 g/lit
2,2'-bipyridyl: 2 mg/lit
polyethylene glycol (molecular weight: 1000): 1000 mg/lit
diphenyl sulfoxide: 100 mg/lit (Results of Experiment)

The following Table 1 shows experimental results of Examples and Comparative Examples, that is, the results of evaluation as to the presence/absence of voids or seams, and as to filling states of the plating copper. A microscope (DMI3000M by Leica Camera AG) was used for observing the cross section.

It will be observed that, in the evaluation of the experimental results, Example 1 and Comparative Examples 1, 2, 4 and 5 differ from Example 2 and Comparative Example 3 as to the trench forming process, specifically, as to using or not using a masking tape. For this reason, the definitions of the 'plating thickness on substrate surface', 'recess' and 'in-trench plating thickness' indicated in Table 1, differ from one of the respective Examples or Comparative Examples to another, as specifically shown in FIG. 1. Example 1 and Comparative Examples 1, 2, 4 and 5 follow the definitions of FIG. 1A and Example 2 and Comparative Example 3 follow the definitions of FIG. 1B.

TABLE 1

| | plating thickness on board surface (μm) | in-trench plating thickness (μm) | recess (μm) | presence/ absence of void or seam | filling performance |
|---|---|---|---|---|---|
| Ex. 1 | 3.6 | 11.6 | 5.0 | absent | good |
| Ex. 2 | 0.0 | 15.0 | 0.7 | absent | good |
| Comp. Ex. 1 | 8.8 | 10.0 | 11.4 | present | bad |
| Comp. Ex. 2 | 2.7 | 4.7 | 11.1 | absent | bad |
| Comp. Ex. 3 | 10.5 | 15.3 | 11.0 | present | bad |
| Comp. Ex. 4 | 4.1 | 3.5 | 13.6 | absent | bad |
| Comp. Ex. 5 | 3.3 | 2.9 | 13.4 | absent | bad |

As indicated in the results of Table 1, voids or seams are produced in a trench with the Comparative Examples 1 and 3, such that the trench cannot be filled sufficiently with plating copper. With the Comparative, Example 2, voids or seams were not noticed in the trench, however, the trench was not sufficiently filled with plating copper.

In the Comparative Examples 4 and 5, voids or seams were not noticed in the trench, however, the trench was not sufficiently filled with plating copper.

In Examples 1 and 2, in which the electroless copper plating solution according to an embodiment of the present invention was used, plating copper could be sufficiently deposited into the trench without producing defects such as voids or seams in the trench, in contrast to the Comparative Examples 1 to 5. It has also been found that plating copper could be sufficiently deposited into the trench with a plating thickness of 11.6 μm (Example 1) or 15.0 μm (Example 2), as may be seen from the fact that the depth of the recess is less than one half of that of Comparative Examples 1 to 3, thus allowing fabrication of a satisfactory printed circuit board.

From the above result, it has thus been found that, by using the electroless plating solution of the present embodiment, plating metal can be sufficiently deposited into a large-sized trench or via without producing the defects such as voids or seams.

It should be understood by those skilled in the art that various modifications, combinations, sub-combinations or alterations may occur depending on design requirements and other factors insofar as they are within the scope of the appended claims or the equivalents thereof.

Figure 1A:
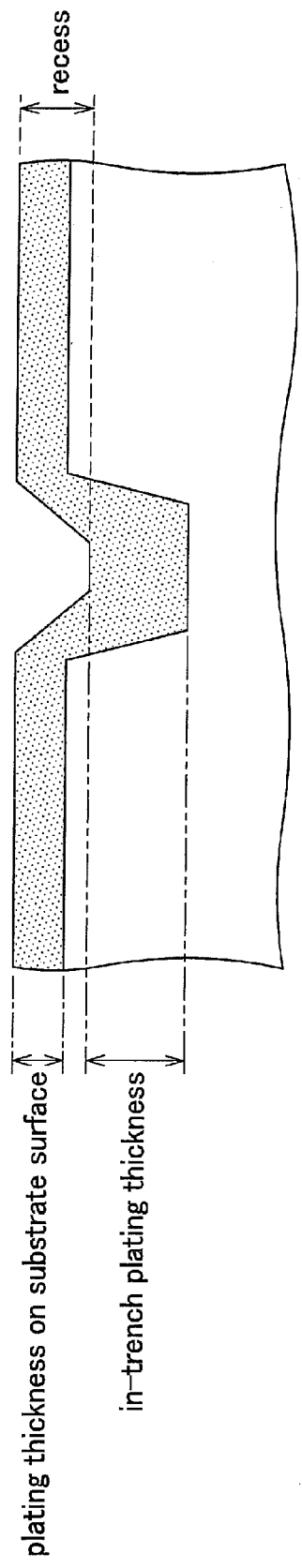
FIGS. 1A and 1B are schematic views for illustrating the 'plating thickness on board surface', 'recess' and 'in-trench plating thickness' in a board subjected to plating.
Figure 1B:
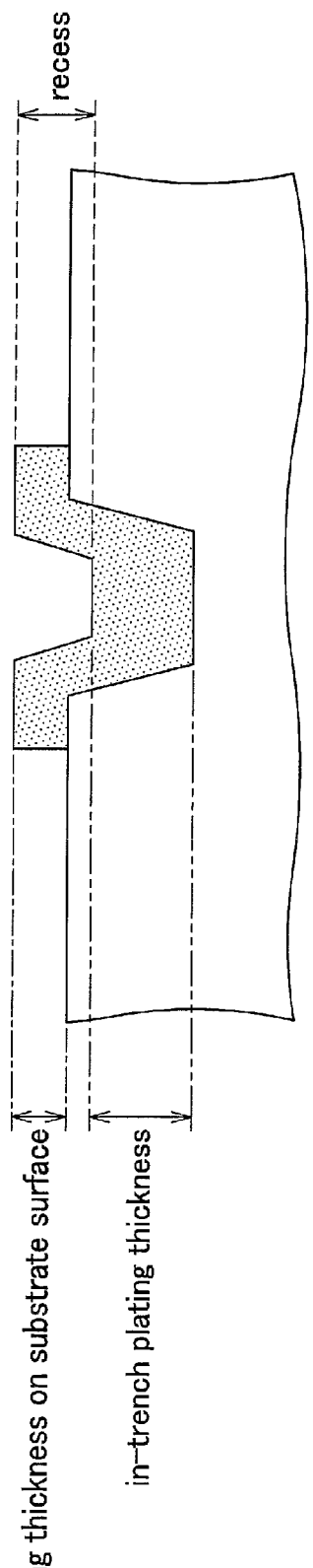

What is claimed is:

1. An electroless plating solution at least containing a water-soluble metal salt, a reducing agent and a chelating agent, and also containing a leveler composed of at least one of sulfur-based organic compounds represented by the following formulas (I) to (V):

$$R^1\text{---}(S)_n\text{---}R^2 \ (n \geq 3) \qquad (I)$$

$$R^1\text{-}L^1\text{-}(S)_n\text{---}R^2 \ (n \geq 1) \qquad (II)$$

$$R^1\text{-}L^1\text{-}(S)_n\text{-}L^2\text{-}R^2 \ (n \geq 1) \qquad (III)$$

$$R^1\text{---}(S)_n\text{-}L^3 \ (n \geq 1) \qquad (IV)$$

$$R^1\text{-}L^1\text{-}(S)_n\text{-}L^4 \ (n \geq 1) \qquad (V)$$

wherein, in the above formulas (I) to (V), $R^1$, $R^2$ each independently denotes an aliphatic cyclic group or an aromatic cyclic group containing optional numbers of carbon, oxygen, phosphorus, sulfur and nitrogen atoms, provided that at least one optional substituent of at least one species may be linked to the aliphatic cyclic or aromatic cyclic group;

wherein in the above formulas (II), (III) and (V), $L^1$, $L^2$ each independently denotes one of a straight or a branched alkyl, alkyl amino, alkylene or alkoxy chain;

wherein in the above formula (IV), $L^3$ denotes one of alkylene, amino, alkyl amino, alkylene amino, hydroxyl, alkyl hydroxyl, alkylene hydroxyl, carboxyl, alkyl carboxyl, alkylene carboxyl, alkyl amino carboxyl, alkylene amino carboxyl, nitro, alkylnitro, nitrile, alkylnitrile, amide, alkylamide, carbonyl, alkyl carbonyl, sulfonic acid, alkylsulfonic acid, phosphonic acid, alkylphosphonic acid, sulfanyl, sulfinyl and thiocarbonyl groups; and wherein in the above formula (V), $L^4$ denotes one of an alkyl, alkylene, amino, alkyl amino, alkylene amino, hydroxyl, alkyl hydroxyl, alkylene hydroxyl, carboxyl, alkyl carboxyl, alkylene carboxyl, alkyl amino carboxyl, alkylene amino carboxyl, nitro, alkylnitro, nitrile, alkylnitrile, amide, alkylamide, carbonyl, alkyl carbonyl, sulfonic acid, alkylsulfonic acid, phosphonic acid, alkylphosphonic acid, sulfanyl, sulfinyl and thiocarbonyl groups.

2. An electroless plating solution at least containing a water-soluble metal salt, a reducing agent and a chelating agent, and also containing a leveler composed of at least one sulfur-based organic compound selected from the group consisting of 2,2'-dipyridyl disulfide, 6,6'-dithio dinicotinic acid, 2,2'-dithio dibenzoic acid and bis (6-hydroxy-2-naphthyl)disulfide.

3. The electroless plating solution according to claim 1 wherein the concentration of the sulfur-based organic compound is 0.05 mg/lit to 50 mg/lit.

4. An electroless plating method employing the electroless plating solution according to claim 1.

5. A method for manufacturing a circuit board comprising filling a trench or a via formed in a board with a plating metal, by electroless plating processing employing the electroless plating solution according to claim 1.

6. The electroless plating solution according to claim 2 wherein the concentration of the sulfur-based organic compound is 0.05 mg/lit to 50 mg/lit.

7. An electroless plating method employing the electroless plating solution according to claim 2.

8. A method for manufacturing a circuit board comprising filling a trench or a via formed in a board with a plating metal, by electroless plating processing employing the electroless plating solution according to claim 2.

* * * * *